United States Patent [19]

Yoshimori

[11] Patent Number: 5,175,494
[45] Date of Patent: Dec. 29, 1992

[54] TEST SIMPLIFYING CIRCUIT CONTAINED IN DIGITAL INTEGRATED CIRCUIT

[75] Inventor: Takashi Yoshimori, Yokohama, Japan

[73] Assignee: Kabushiki Kaisha Toshiba, Kawasaki, Japan

[21] Appl. No.: 588,190

[22] Filed: Sep. 26, 1990

[30] Foreign Application Priority Data

Sep. 29, 1989 [JP] Japan .................................. 1-252185

[51] Int. Cl.$^5$ ...................... G01R 31/28; G01R 31/02
[52] U.S. Cl. ................. 324/158 R; 324/73.1; 371/22.3; 371/22.6
[58] Field of Search .......... 324/158 R, 73.1; 371/22.4, 22.6, 15.1, 27, 21.2, 22.3; 307/465; 365/201

[56] References Cited

U.S. PATENT DOCUMENTS

| | | | |
|---|---|---|---|
| 3,790,885 | 2/1974 | James | 324/73 |
| 4,366,393 | 12/1982 | Kasuya | 307/465 |
| 4,598,401 | 7/1986 | Whelan | 371/22.4 |
| 4,749,947 | 6/1988 | Gheewala | 371/22.6 |
| 4,975,640 | 12/1990 | Lipp | 371/22.6 |

OTHER PUBLICATIONS

Bhavsar et al; "Self Testing by Polynomial Division"; IEEE 1981 International Test Conference; pp. 208–216.

*Primary Examiner*—Vinh Nguyen
*Attorney, Agent, or Firm*—Finnegan, Henderson, Farabow, Garrett and Dunner

[57] ABSTRACT

A test simplifying circuit is based on a compact test method which is a test method for applying a test pattern series generated from a random pattern generator to a digital circuit to be tested and at the same time for compressing a response output of the to-be-tested circuit by use of a data compactor, and determining the result of data compression. The memory circuits and input/output circuits originally contained in an integrated circuit are used as the random pattern generator and data compactor used for the test, and the random pattern generator and data compactor are reconstructed by the memory circuits and the input/output circuits.

5 Claims, 10 Drawing Sheets

| TEST | T1 | T2 | OPERATION MODE |
|---|---|---|---|
| 0 | — | — | NORMAL OPERATION MODE |
| 1 | 0 | 0 | SCAN TEST MODE |
| 1 | 0 | 1 | COMPACT TEST MODE |
| 1 | 1 | 0 | EXTERNAL WIRING TEST MODE (INPUT) |
| 1 | 1 | 1 | EXTERNAL WIRING TEST MODE (OUTPUT) |

| T1 | T2 | S1 | S2 | MODE |
|---|---|---|---|---|
| — | — | 0 | — | NORMAL OPERATION MODE |
| 0 | 0 | 1 | 1 | SCAN TEST MODE |
| 0 | 1 | 1 | 0 | COMPACT TEST MODE |

TEST SIMPLIFYING CIRCUIT CONTAINED IN DIGITAL INTEGRATED CIRCUIT

BACKGROUND OF THE INVENTION

1. Field of the Invention

This invention relates to a test simplifying circuit in a large-scale digital system, and more particularly to a test simplifying circuit for permitting self testing of a large-scale integrated circuit.

2. Description of the Related Art

Figure 1:
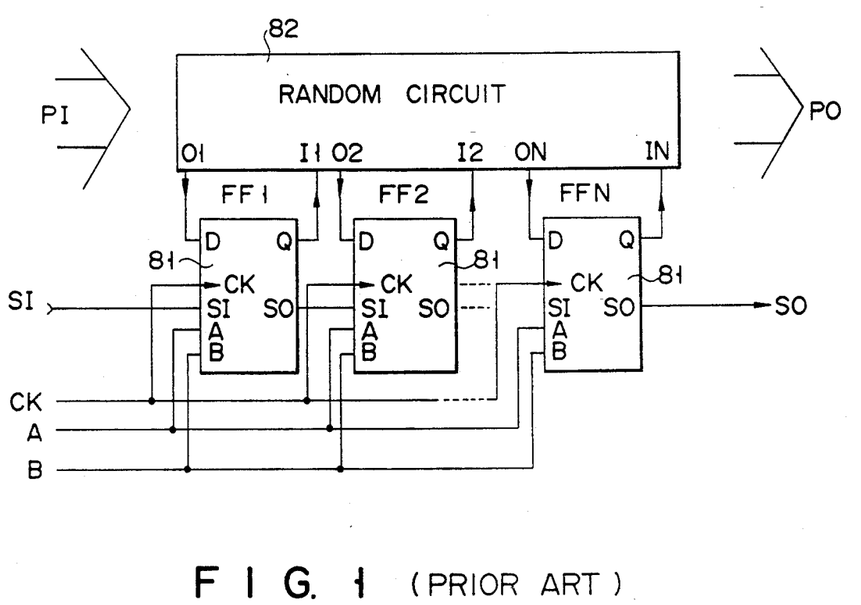
FIG. 1 is a circuit diagram for illustrating the conventional test method.

A scan test method is known as a conventional technique for simplifying testing of a large-scale digital system. The scan test method is effected by use of a circuit shown in FIG. 1. That is, a plurality of memory elements 81 provided in a synchronous digital circuit are connected in a shift register configuration when a test is effected. Serial data SI is sequentially supplied to the memory elements 81. As a result, desired values are set into the respective memory elements 81, and the values set in the memory elements 81 and external input data PI are supplied to a random circuit (combinational circuit) 82. The test is effected by storing data other than PO which is external output data among the output signals of the random circuit 82 into the memory elements 81 again and reading out the data as serial data SO in a serial manner.

That is, in this scan test method, it is possible to deal with data input and output lines to the internal memory elements as imaginary external input/output terminals. As a result, the entire circuit can be dealt with as an imaginary combinational circuit.

A test data automatic generation method capable of detecting defects in the combinational circuit with a fault detection rate of 100% is known in the art. Therefore, it becomes possible to automatically generate test data in a digital system in which data can be scanned.

However, in this scan test method, serial data must be supplied when the test is effected. Therefore, when the circuit is formed on a large scale, an expensive testing device is used and the test period becomes a problem. Further, the scan test method cannot comply with the self-test which is the most ideal scan test at present.

Figure 2:
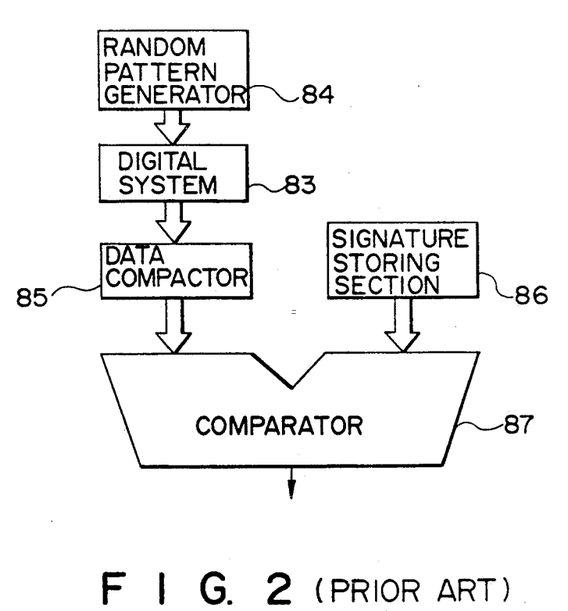
FIG. 2 is a circuit diagram for illustrating the conventional compact test method.

Further, a compact test method for enabling the self-test is the conventional technique. The compact test method is effected by using the circuit shown in FIG. 2. That is, the test method is effected by supplying a test pattern created by a random pattern generation circuit 84 to a digital system 83 to be tested, compressing a response output generated at this time from the to-be-tested object by means of a data compactor 85, and comparing the same with a signature read out from a signature storing section 86, and indicating the final state of the compactor by use of using a comparator 87 to determine whether the to-be-tested digital system 83 is normal or not. In general, a linear feedback shift register, which is hereinafter referred to as LFSR, is used in each of the random pattern generator 84 and the data compactor 85. In a case where the random pattern generator, data compactor, and signature comparing means are formed in an integrated circuit, this method has a feature that the self-test of the integrated circuit can be effected. However, In this method, since a random pattern is supplied to the to-be-tested object, the following problem occurs. That is, even when a large amount of random patterns are supplied to a general sequential circuit, the fault detection rate may not be raised in some cases.

In this case, a generation pattern must be created according to the circuit-signature of the digital system to be tested. Further, in the case of the sequential circuit, care must be taken to the timings at which patterns are supplied. Therefore, when a random pattern is supplied, the timing specification of the digital system to be tested must be satisfied. The above two problems are serious problems when the compact test method is applied to a general digital system and make the design of a test simplifying circuit complicated.

Further, in this method, it is possible to determine whether the to-be-tested object is effective or not, but it cannot comply with the case wherein an analysis such as identification of the fault position must be effected.

Figure 3:
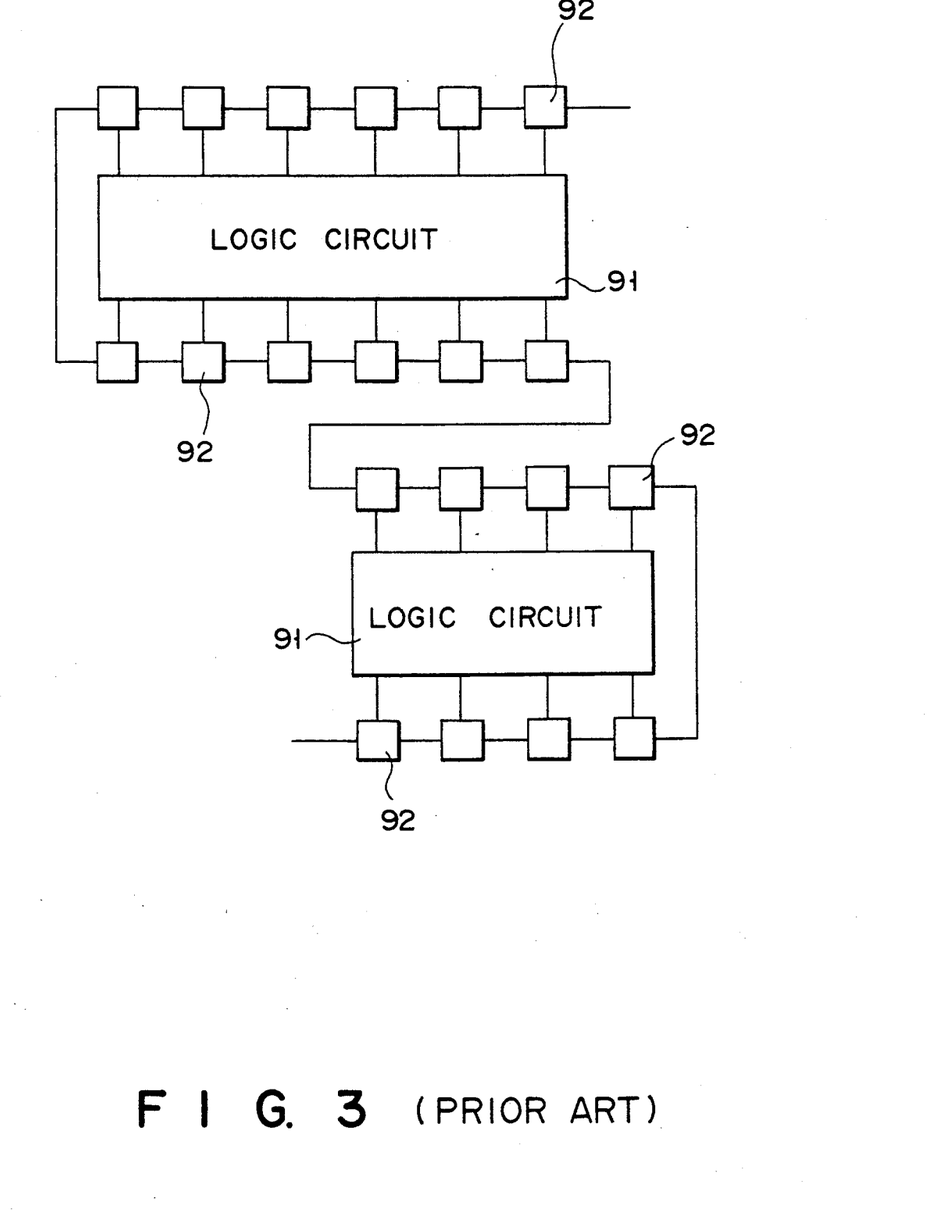
FIG. 3 is a circuit diagram for illustrating the conventional scan test method.

A boundary scan test method is known as another conventional test method. This method is effected by use of the circuit shown in FIG. 3. In this test method, storage elements 92 are provided for respective input-/output signals corresponding to boundary portions of logic circuits 91 to be tested. The method is used to simplify the test by reconstructing them to perform the shift operation when the test operation is effected. In a case where a test pattern having a fixed fault detection rate for a specified logic circuit is prepared, the test for the logic circuit to be tested can be effected by applying the pattern to the boundary portion of the boundary scan in a sequential manner and observing the same. Further, a test for wirings (external wirings) between individual logic circuits having the boundary scan function added can be effected by use of the same circuit. This method has the above described advantages, but at the same time it has the following problems. In a case where no test pattern for testing the individual logic circuits is present, the value of the circuit as the test simplifying circuit is reduced. Further, like the compact test method, special care must be taken into consideration when a digital circuit to be tested in the boundary scan is a sequential circuit and if it is necessary to pay attention to the relationship between timings of application of the test patterns.

Thus, conventionally, the scan method, compact test method, boundary scan method and the like are provided as a test technique for systematically simplifying the test for large-scale digital systems. However, they have individual problems as described above.

SUMMARY OF THE INVENTION

Accordingly, an object of this invention is to provide a test-simplifying circuit which is contained in a digital integrated circuit to be tested and can realize a test simplifying method capable of effecting a self-test without receiving any influence by the digital integrated circuit.

According to this invention, there is provided a test simplifying circuit contained in a digital integrated circuit comprising a random circuit formed of a combinational circuit; a plurality of memory circuits; a plurality of external terminals; and a plurality of input/output circuits respectively connected to the plurality of external terminals, for transferring data with respect to the exterior of the integrated circuit wherein part or all of the plurality of memory circuits and the plurality of input/output circuits are connected to constitute a linear feedback shift register at the time of test operation.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate a presently preferred embodiment of the invention, and together with the general description given above and the detailed description of the preferred embodiment given below, serve to explain the principles of the invention.

DETAILED DESCRIPTION OF THE PREFERRED EMBODIMENTS

First, a random pattern generator and a data compactor which are each formed of an LFSR used in a test simplifying circuit of this invention are explained.

Figure 4:
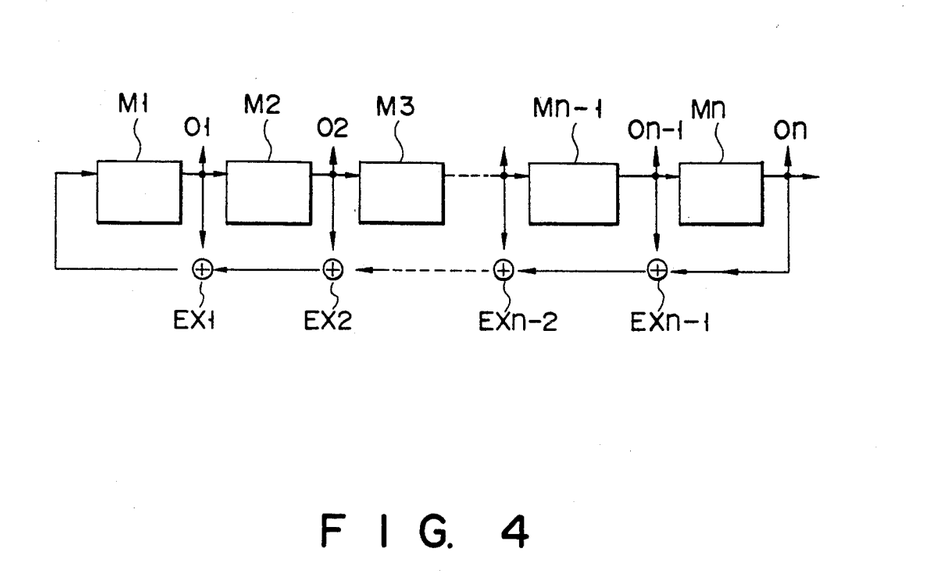
FIG. 4 is a block diagram showing the general construction of a random pattern generator formed of a linear feedback shift register.

FIG. 4 shows a general construction of a random pattern generator formed of an LFSR. In FIG. 4, M1, M2, M3, ---, Mn-1 and Mn each denote a memory circuit formed of a 1-bit flip-flop. Further, EX1, EX2, ---, Exn-2 and EXn-1 each denote an exclusive OR circuit. A plurality of memory circuits M1, M2, M3, ---, Mn-1 and Mn are cascade connected so that an output (O1, O2, ---, On-1) of the preceding stage can be supplied to a corresponding succeeding stage, and an output (O1, O2, ---, On-1, On) of a desired stage is fed back to the first-stage memory circuit M1 via a desired one of the exclusive OR circuits (EX1, EX2, ---, EXn-2, EXn-1). The positions of the exclusive OR circuits EX1, EX2, ---, EXn-2, EXn-1 are determined by the bit length and system of the LFSR.

Figure 5:
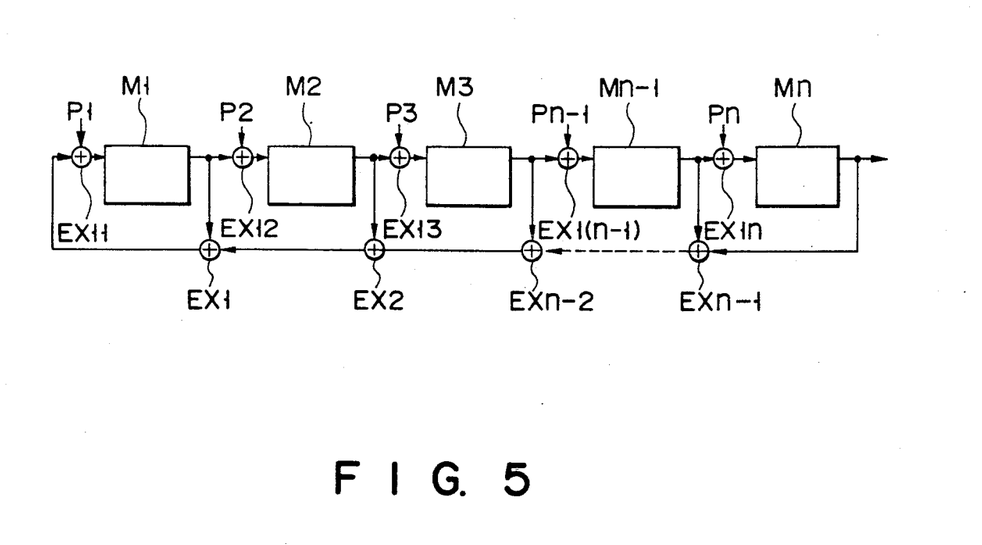
FIG. 5 is a block diagram showing the general construction of a data compactor formed of a linear feedback shift register.

On the other hand, as shown by the block diagram of FIG. 5, in the data compactor formed of an LFSR, exclusive OR circuits EX11, EX12, EX13, ---, EX1(n-1) and EX1n are arranged in the preceding stages of the respective memory circuits M1, M2, M3, ---, Mn-1 and Mn of the random pattern generator to derive exclusive logical sums of input data to be compressed. Also, in the data compactor, the positions of the exclusive OR circuits EX1, EX2, ---, EXn-2, EXn-1 are determined by the bit length and system of the LFSR.

Next, the test simplifying circuit of this invention which is applied in a digital integrated circuit is explained with reference to FIG. 6. The test system of the test simplifying circuit of this embodiment has basically five operation modes in total including four test modes and a normal operation mode. The four test modes are determined by three mode setting control signals TEST, T1, and T2. The relationship between the three control signals and the operation modes is shown in FIG. 7. That is, when the control signal TEST is at a "0" level, the normal operation mode is set irrespective of the level of the control signals T1 and T2. When the control signal TEST is set at a "1" level, a test mode is set. In this case, if the control signals T1 and T2 are both set at the "0" level, a scan test mode is set, if the control signals T1 and T2 are set at the "0" and "1" levels, respectively, a compact test mode is set; if the control signals T1 and T2 are set at the "1" and "0" levels, respectively, an external wiring test mode (input) is set, and if the control signals T1 and T2 are both set at the "1" level, an external wiring test mode (output) is set. Each mode will be described in detail later.

Figure 6:
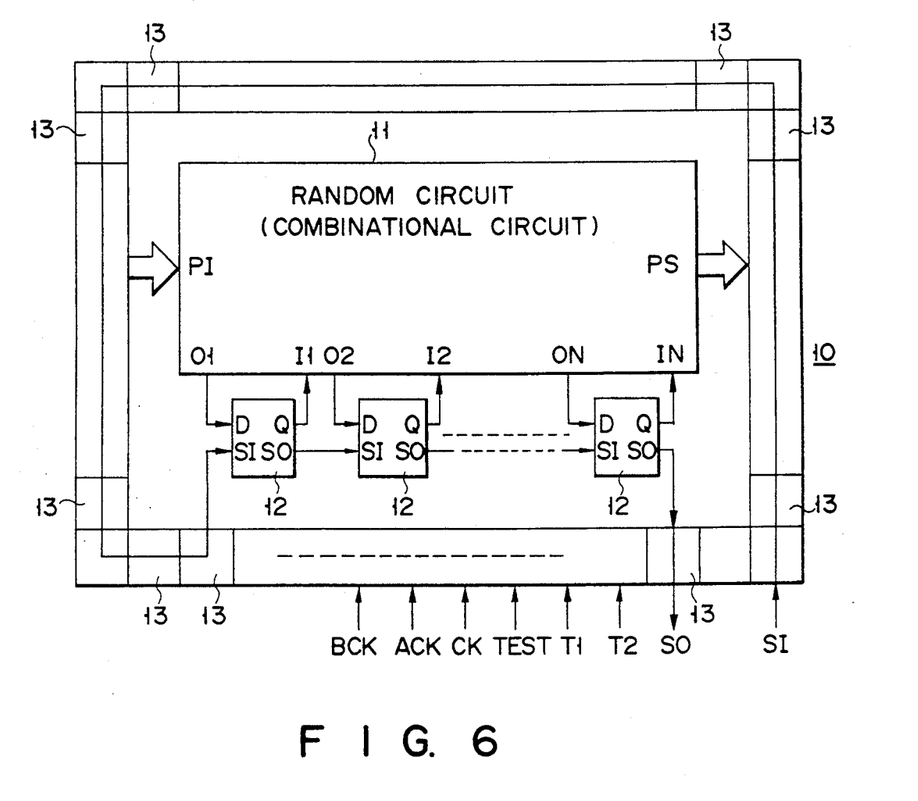
FIG. 6 is a circuit diagram showing the construction of a test simplifying circuit according to one embodiment of this invention obtained when the circuit is set in the scan mode and external wiring test mode.
Figure 7:
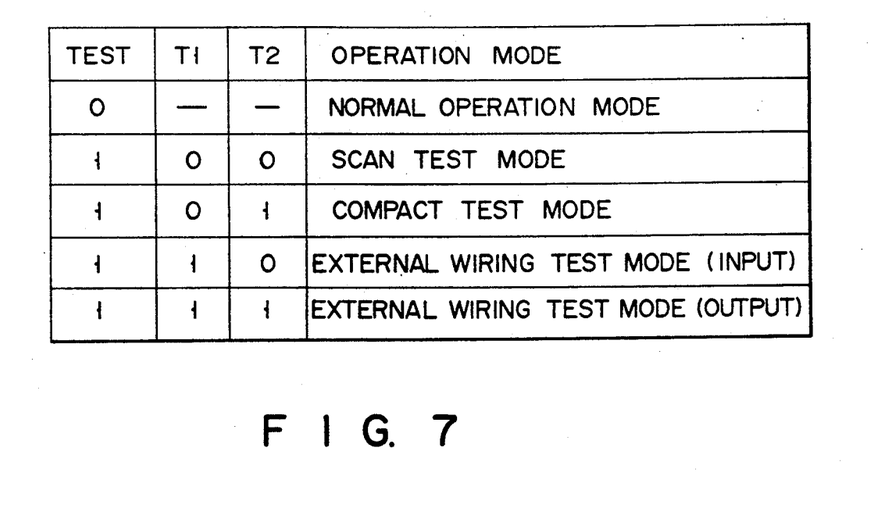
FIG. 7 is a diagram showing the states of various test modes in the circuit of the embodiment shown in FIG. 6.

The circuit of this embodiment shown in FIG. 6 indicates the construction set in the scan test mode and external wiring test mode. In one semiconductor integrated circuit 10, random circuit (combinational circuit) 11, a plurality of memory circuits 12 and plurality of input/output circuits 13 are provided. The plurality of input/output circuits 13 permit data transfer between external terminals (not shown in FIG. 6) and the internal portion of the integrated circuit 10. The plurality of input/output circuits 13 and the plurality of memory circuits 12 are cascade connected to permit the data boundary scanning operation to be effected. Serial data SI is input to the first stage of the cascade connected input/output circuits 13 and serial data SO is output from the last stage of the input/output circuits 13. In addition to the three control signals TEST, T1 and T2 and serial data SI, three synchronizing clock signals ACK, BCK and CK are supplied to the semiconductor integrated circuit 10. The clock signals ACK, BCK are used as shifting clocks and the clock signal CK is used as a system clock.

With the above construction, data can be set and monitored from the exterior, and the semiconductor integrated circuit 10 can be tested by use of the boundary scan method.

Figure 8:
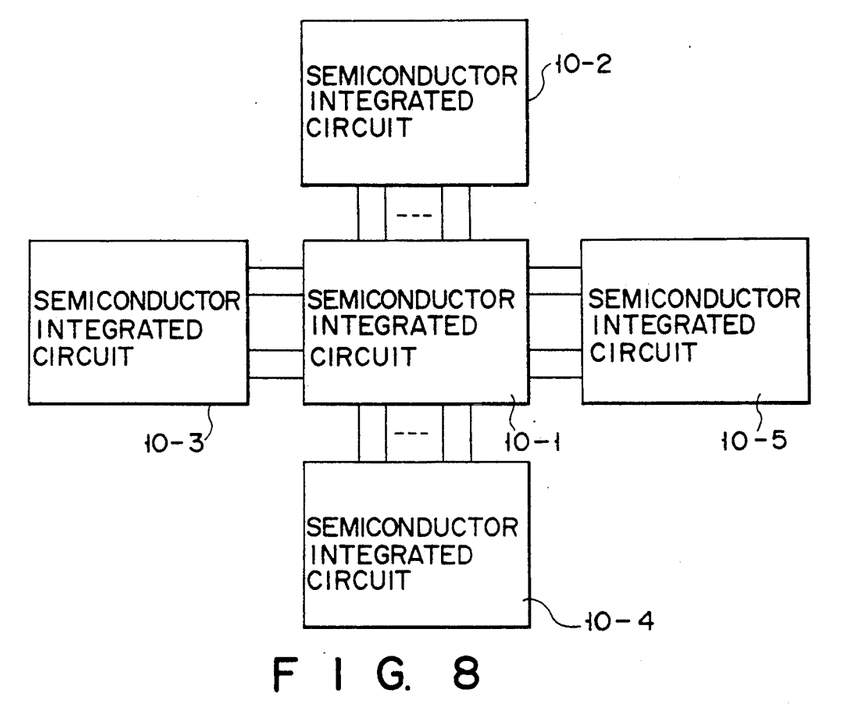
FIG. 8 is a circuit diagram showing the construction of a test simplifying circuit according to the embodiment shown in FIG. 6 obtained when it is set in the external wiring test mode.

Since the test can be effected by use of the boundary scan method, it becomes possible to test the external wirings (wirings on the printed circuit board, for example) for connecting a plurality of semiconductor integrated circuits 10-1 to 10-5 to one another as shown in FIG. 8. As shown in FIG. 7, the external test mode includes basically two modes, an input mode and an output mode. In this test, the semiconductor integrated circuit 10-1 is set in the output mode and the remaining semiconductor integrated circuits 10-2 to 10-5 are set in the input mode by the control signals T1 and T2. An output from the semiconductor integrated circuit 10-1 set in the output mode is sequentially supplied to the first stage of the input/output circuits 13 (shown in FIG. 6) which is boundary scanned in the semiconductor integrated circuits 10-2 to 10-5 which have been set in the input mode. The test for the external wirings can be effected by determining the values of outputs from the last stages of the input/output circuits 13 after data has been sequentially shifted in the respective semiconductor integrated circuits 10-2 to 10-5.

Figure 9:
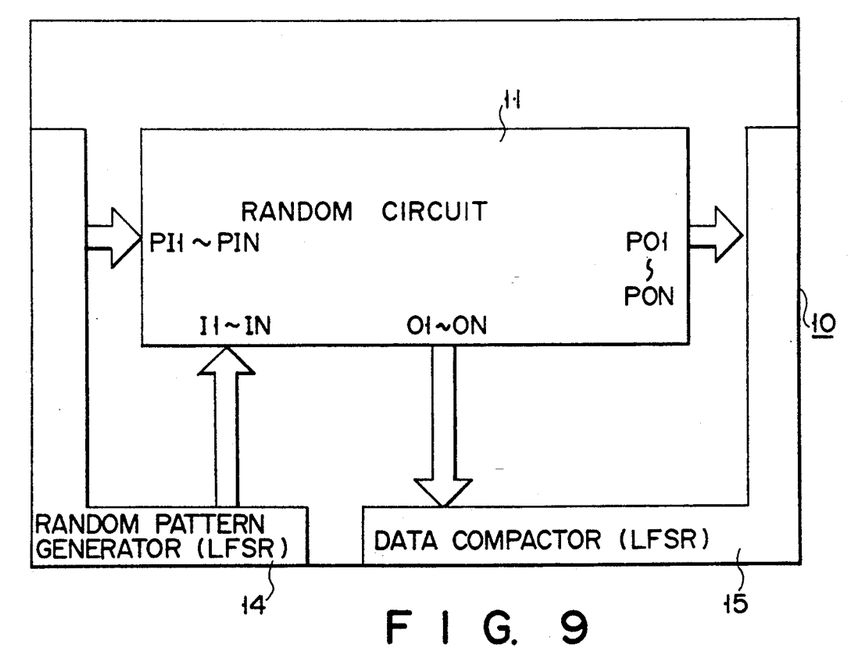
FIG. 9 is a circuit diagram showing the construction of a test simplifying circuit according to the embodiment shown in FIG. 6 obtained when it is set in the compact test mode.

The circuit of FIG. 9 shows the construction set in the compact test mode. In FIG. 9, reference numeral 14 denotes a random pattern generator formed of an LFSR constituted by part of the plurality of memory circuits 12 and part of the plurality of input/output circuits 13. Reference numeral 15 denotes a data compactor formed of an LFSR constituted by part of the plurality of memory circuits 12 and part of the plurality of input/output circuits 13.

With the above construction, data items I1 to IN output from the random pattern generator 14 formed of the LFSR is supplied to the random circuit (combinational circuit) 11. Further, parallel output data PO1 to PON and output data 01 to ON of the random circuit 11 are supplied as input data to the data compactor 15 formed of the LFSR.

The problems in the conventional compact test method can be solved by realizing the above described construction in the compact test mode. That is, since a circuit to be subjected to the compact test can be limited to the random circuit 11, reduction in the fault detection rate and occurrence of timing problems can be prevented.

In order to effect the above scan test and compact test, a special device must be made for the plurality of memory circuits 12 and the plurality of input/output circuits 13. That is, a special device must be made to realize memory elements capable of shifting data in the input/output circuits 13 constituting the boundary structure in the scan test mode and reconstruct the same portion as the random pattern generator and data compactor for the input terminals and the output terminals, respectively, in the compact test mode. Likewise, in the memory circuit 12, a special device must be made to constitute a shift register capable of scanning data in the scan test mode and it is necessary to realize the random pattern generator for supplying random patterns to imaginary input terminals (terminals I1 to IN) of the combinational circuit portion and the data compactor capable of compressing output values of imaginary output terminals (terminals 01 to ON) in the compact test mode.

Figure 10:
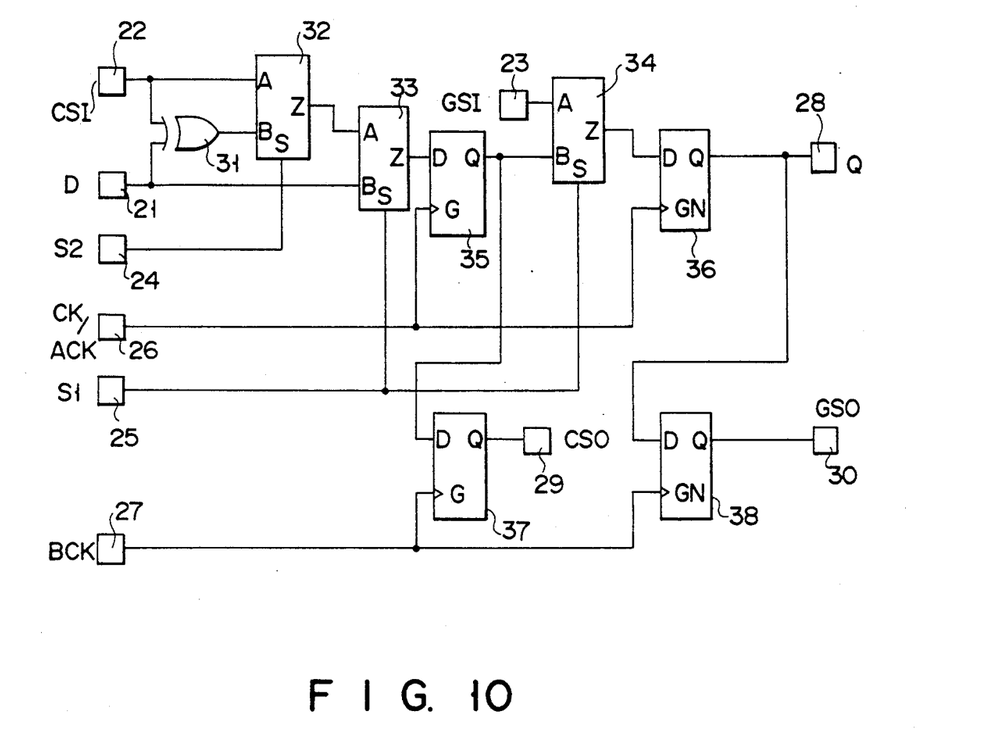
FIG. 10 is a circuit diagram showing the concrete construction of the memory circuit used in the circuit of the embodiment shown in FIG. 6.

FIG. 10 is a circuit diagram showing an example of the memory circuit 12 used in the circuit of the embodiment shown in FIG. 6. In FIG. 10, reference numeral 21 to 27 respectively denote input nodes to which input data D, input data CSI, input data GSI, control signal S2, control signal S1, clock signals CK/ACK and BCK are supplied, Reference numerals 28 to 30 respectively denote output nodes from which output data Q, CSO, and GSO are output. Reference numeral 31 denotes an exclusive OR circuit. Reference numerals 32 to 34 denote 2-input multiplexers, and reference numeral 35 to 38 denote D-type latch circuits. The multiplexers 32 to 34 output an A input from output Z when the control input S is at the "1" level and output a B input from output Z when S is at the "0" level. Further, the latch circuits 35 and 37 are both set into the through mode and the latch mode when the clock input G is set at the "1" and "0" levels, respectively, and in contrast, the remaining latch circuits 36 and 38 are both set into the through mode and the latch mode when the clock input GN is set at the "0" and "1" levels, respectively.

The exclusive OR circuit 31 is supplied with the input data D and input data CSI and an output thereof is supplied to the multiplexer 32 as a B input. The multiplexer 32 is supplied with the input data CSI as an A input. Further, the multiplexer 32 is supplied with the control signal S2 of the input node 24 as a control input S. An output of the multiplexer 32 is supplied to the multiplexer 33 as an A input. The multiplexer 33 is supplied with the input data D as a B input. Further, the multiplexer 33 is supplied with the control signal S1 of the input node 25 as a control input S. An output of the multiplexer 33 is supplied to the latch circuit 35 as data D. The latch circuit 35 is supplied with the clock signal CK/ACK of the input node 26 as a clock input G. An output of the latch circuit 35 is supplied to the multiplexer 34 as a B input. The multiplexer 34 is supplied with the input data GSI as an A input. Further, the multiplexer 34 is supplied with the control signal S1 of the input node 25 as a control input S. An output of the multiplexer 34 is supplied to the latch circuit 36 as data D. The latch circuit 36 is supplied with the clock signal CK/ACK of the input node 26 as a clock input GN. An output of the latch circuit 36 is output from the output node 28 as output data Q.

On the other hand, an output of the latch circuit 35 is supplied to the latch circuit 37 as data D. The latch circuit 37 is supplied with the clock signal BCK of the input node 27 as a clock input G. An output of the latch circuit 37 is output from the output node 29 as output data CSO.

Further, an output of the latch circuit 36 is supplied to the latch circuit 38 as data D. The latch circuit 38 is supplied with the clock signal BCK of the input node 27 as a clock input GN. An output of the latch circuit 38 is output from the output node 30 as output data GSO.

Figure 11:
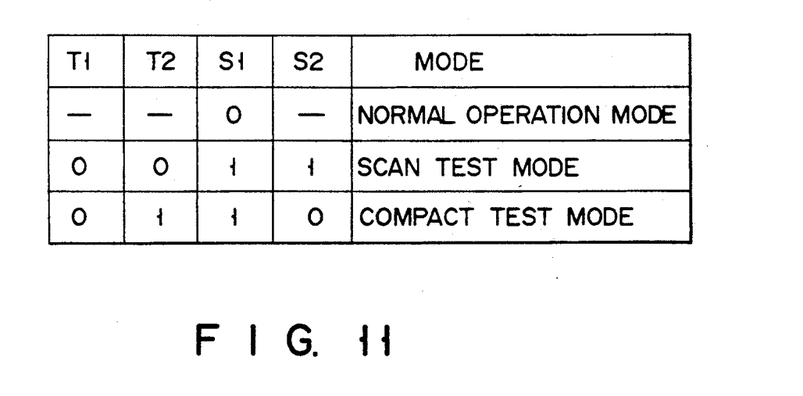
FIG. 11 is a diagram showing the operation modes of the circuit of FIG. 10.

In the memory circuit 12 with the above construction, the levels of the control signals S2 and S1 on the two input nodes 24 and 25 are determined according to the three control signals TEST, T1 and T2 by a control circuit (not shown). That is, as shown in FIG. 11, for example, only the control signal S1 is set at the "0" level in the normal operation mode in which the control signal TEST is set at the "0" level. Further, in the test mode in which the control signal TEST is set at the "1" level, the control signals S2 and S1 are both set at the "1" level in the scan test mode in which the two control signals T1 and T2 are set at the "0" level. Further, in the test mode, the control signals S2 and S1 are respectively set at the "1" and "0" levels in the compact test mode in which the control signals T1 and T2 are respectively set at the "0" and "1" levels.

The operation of the memory circuit 12 with the above construction is explained below.

First, in the normal operation mode in which only the control signal S1 is set at the "0" level, the B input is output from Z in each of the two multiplexers 33 and 34. As a result, input data D of the input node 21 is latched in the master-slave type latching structure formed of the latch circuits 35 and 36 and output from the output node 28 as output data Q.

Next, in the scan test mode in which the control signals S1 and S2 are both set at the "1" level, the A input is output from output Z in each of the three multiplexers 32, 33, and 34. As a result, input data CSI of the input node 22 is shifted by a master-slave type latching structure having the latch circuits 35 and 37, respectively used as master and slave units, and output from the output node 29 as output data CSO. The clock signals ACK and BCK of the two input nodes 26 and 27 having edges separated from each other are used as the shift clock signals for effecting the shifting operation. Further, at this time, input data GSI of the input node 23 is shifted by a master-slave type latching structure having the latch circuits 36 and 38, respectively used as master and slave units, and output from the output node 30 as output data GSO. Also, in this case, the two clock signals ACK and BCK having edges separated from each other, are used as the shift clock signals for effecting the shifting operation. That is, in the scan test mode, two input data CSI and GSI are shifted by means of the memory circuit 12.

In the compact test mode in which the control signals S1 and S2 are respectively set at the "1" and "0" levels, a B input is output from output Z in the multiplexer 32 and a B input is output from output Z in each of the remaining multiplexers 33 and 34. At this time, an exclusive logical sum signal of input data D and CSI of the input nodes 21 and 22 is derived by means of the exclusive OR circuit 31 and then shifted by a master-slave type latching structure having the latch circuits 35 and 37, respectively used as master and slave units, and output from the output node 29 as compressed data CSO. Further, input data GSI of the input node 23 is shifted by a master-slave type latching structure having the latch circuits 36 and 38, respectively used as master and slave units, and output from the output node 30 as output data GSO. At this time, if an exclusive OR circuit is inserted in the feedback path of the data GSO, a random pattern can be generated by use of a master-slave type latching structure formed of the exclusive OR circuit and the latch circuits 36 and 38.

Figure 12:
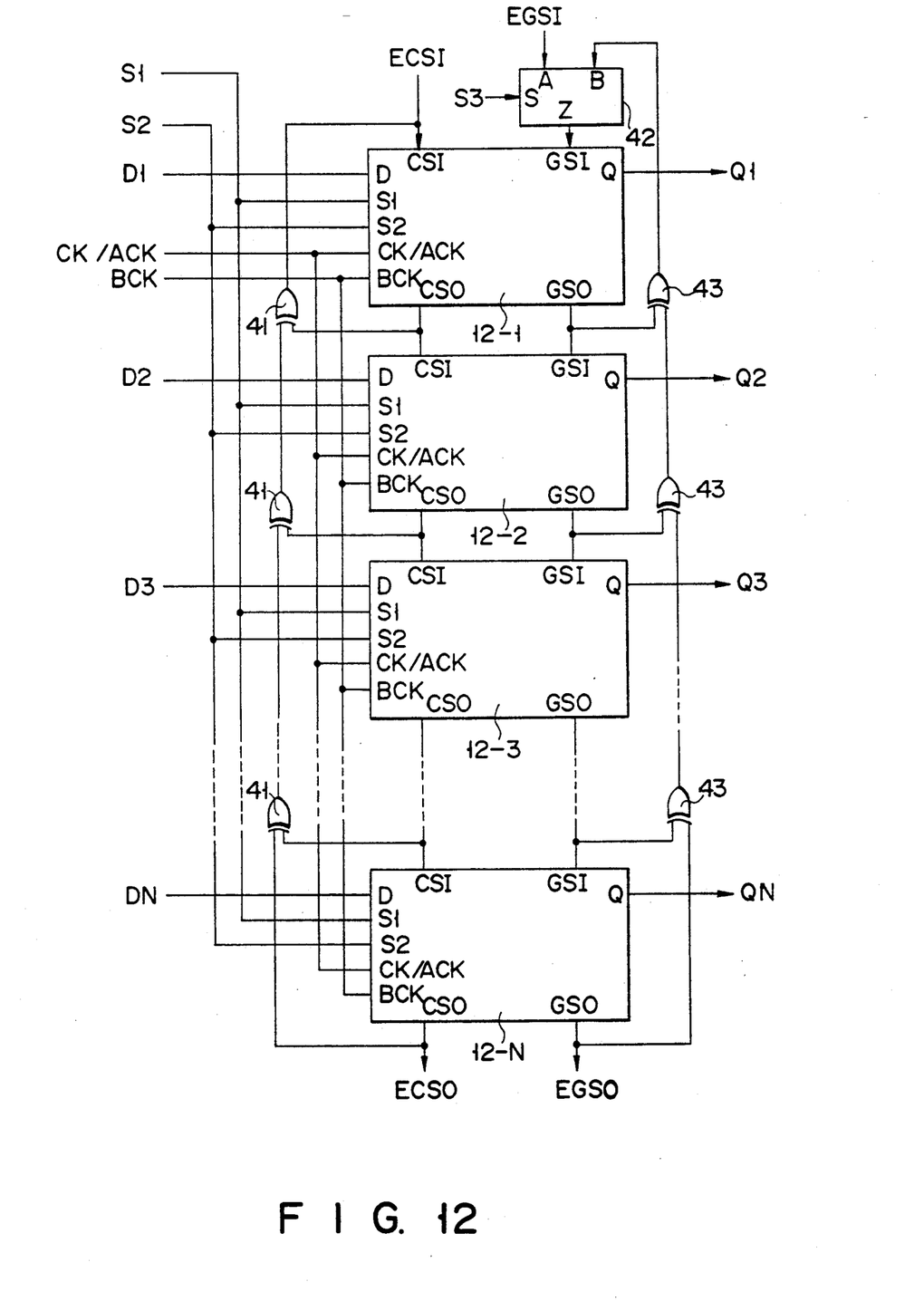
FIG. 12 is a circuit diagram showing the circuit connection between a plurality of memory circuits used in the circuit of the embodiment shown in FIG. 6.

FIG. 12 is a circuit diagram showing the actual connection between the plurality of memory circuits 12 of FIG. 6. The memory circuits 12-1, 12-2, 12-3, ---, 12-N in FIG. 12 are formed with the internal structure as shown in FIG. 10. The plurality of memory circuits 12-1 through 12-N are cascade connected so that respective input nodes for input data CSI and GSI in each stage of the memory circuits can be connected to the respective output nodes for output data CSO and GSO in a corresponding preceding stage memory circuit.

Input data D1, D2, D3, ---, Dn are independently supplied to respective input nodes for input data D of the memory circuits and output data of respective output nodes are independently output as Q1, Q2, Q3, ---, QN. The respective input nodes for the control signals S1 of the memory circuits are connected in parallel and the parallel-connected input nodes are supplied with the control signal S1. Likewise, the respective input nodes for the control signals S2 of the memory circuits are connected in parallel and the parallel-connected input nodes are supplied with the control signal S2. In addition, the respective input nodes for the clock signals CK/ACK of the memory circuits are connected in parallel and the parallel-connected input nodes are supplied with the clock signal CK/ACK. Likewise, the respective input nodes for the clock signals BCK of the memory circuits are connected in parallel and the parallel-connected input nodes are supplied with the clock signal BCK. The input node for input data CSI of the first-stage memory circuit 12-1 is supplied with an output of an exclusive OR circuit 41 for deriving an exclusive logical sum of output data of the memory circuits of desired stages or input data ECSI from the exterior of the integrated circuit. Further, the input node for input data GSI of the first-stage memory circuit 12-1 is supplied with an output of an exclusive OR circuit 43 for deriving an exclusive logical sum of output data of the memory circuits of desired stages via a multiplexer 42. The multiplexer 42 is supplied with input data EGSI from the exterior of the integrated circuit as an A input and the output of the exclusive OR circuit 43 as an B input. In the multiplexer 42, the input data EGSI and the output of the exclusive OR circuit 43 are selected according to the level of the control signal S3 supplied as a control signal S and supplied to the input node for input data GSI of the first-stage memory circuit 12-1.

In this case, the plurality of memory circuits 12-1, 12-2, 12-3, ---, 12-N and the exclusive OR circuit 41 constitute the data compactor 15 formed of the LFSR shown in FIG. 9. Further, the memory circuits 12-1, 12-2, 12-3, ---, 12-N, the exclusive OR circuit 43, and the multiplexer 42 constitute the random pattern generator 14 formed of the LFSR shown in FIG. 9. In FIG. 12, the positions of the exclusive OR circuits 41 and 43 may be different according to the bit length and system of the LFSR as described before.

Figure 13:
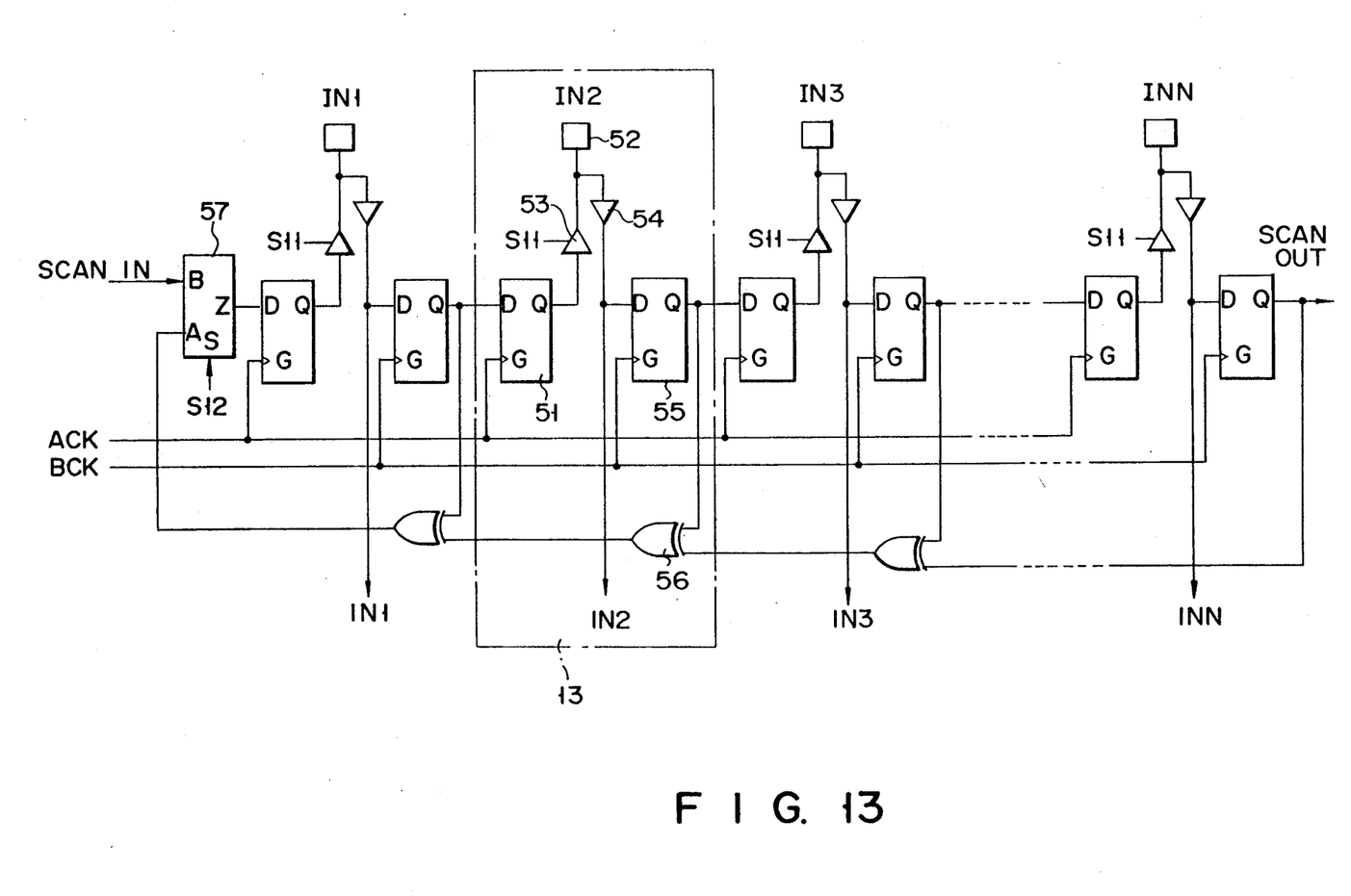
FIG. 13 is a circuit diagram showing the circuit connection between a plurality of input circuits used in the circuit of the embodiment shown in FIG. 6.

FIG. 13 shows a connection between the plurality of input/output circuits 13, shown in FIG. 6, in a case where the input/output circuits 13 are exclusively used for input. As shown in FIG. 13, each of the input/output circuits 13 is controlled by the clock signal ACK and constituted by a D-type latch circuit 51 for latching scan data, a tri-state buffer 53 for controlling the supply of an output of the latch circuit 51 to an external input terminal 52 according to a control signal S11, an input buffer 54 connected to the terminal 52, a D-type latch circuit 55 for latching output data of the input buffer 54, and an exclusive OR circuit 56 for deriving an exclusive logical sum of output data of the latch circuit 55 and output data of a latch circuit 55 of another input/output circuit 13. As will be described later, the position of the exclusive OR circuit 56 is different according to the bit length and system of the LFSR when the random pattern generator formed of the LFSR is reconstructed by the plurality of input/output circuits 13, but in the drawing, the exclusive OR circuits 56 are inserted in all of the positions.

An output of the exclusive OR circuit 56 is supplied to a multiplexer 57 provided in the first stage of the plurality of input/output circuits 13 as an A input. The multiplexer 57 is supplied with scanning input data SCAN IN as a B input and a control signal S12 as a control input S.

With the above construction, the tri-state buffer 53 of each of the input/output circuits 13 is set into a high impedance state by the control signal S11 in the normal operation mode. Therefore, input data IN1, IN2, IN3, ---, INN supplied to the respective external input terminals 52 are supplied in parallel to the random circuit 11 (shown in FIG. 6) via the respective input buffers 54 of the input/output circuits 13.

In the scan test mode, the tri-state buffer 53 of each of the input/output circuits 13 causes an output of the latch circuit 51 to be supplied to a corresponding input buffer 54 according to the control signal S11, and the multiplexer 57 is controlled to output scanning input data SCAN IN which is a B input from output Z. Therefore, in this case, the scanning input data SCAN IN is sequentially shifted by means of a master-slave type latching structure constituted by the latch circuit 51, tri-state buffer 53, input buffer 54 and latch circuit 55 of each of the input/output circuits 13 to have the latch circuits 51 and 55 respectively used as master and slave units and output from the last stage input/output circuit (shown in the rightmost position in the drawing) as scanning output data SCAN OUT.

Further, in the compact test mode, the tri-state buffer 53 of each of the input/output circuits 13 causes an output of the latch circuit 51 to be supplied to a corresponding input buffer 54 according to the control signal S11, and the multiplexer 57 is controlled to supply output data of the exclusive OR circuit 56 which is an A input. Therefore, in this case, a random pattern generator formed of the LFSR is reconstructed.

In the external wiring test mode (output), desired values are set in the latch circuits 51 by previously effecting the serial operation, and then data is output from the input terminal 52 via the tri-state buffer 53 so that data can be supplied to the external wiring (not shown). On the other hand, in the external wiring test mode (input), data from the external wiring (not shown) is supplied to the latch circuit 55 via the input buffer 54 and stored therein, and then the data is sequentially read out by the serial operation and determined so that the external wiring test can be effected.

Figure 14:
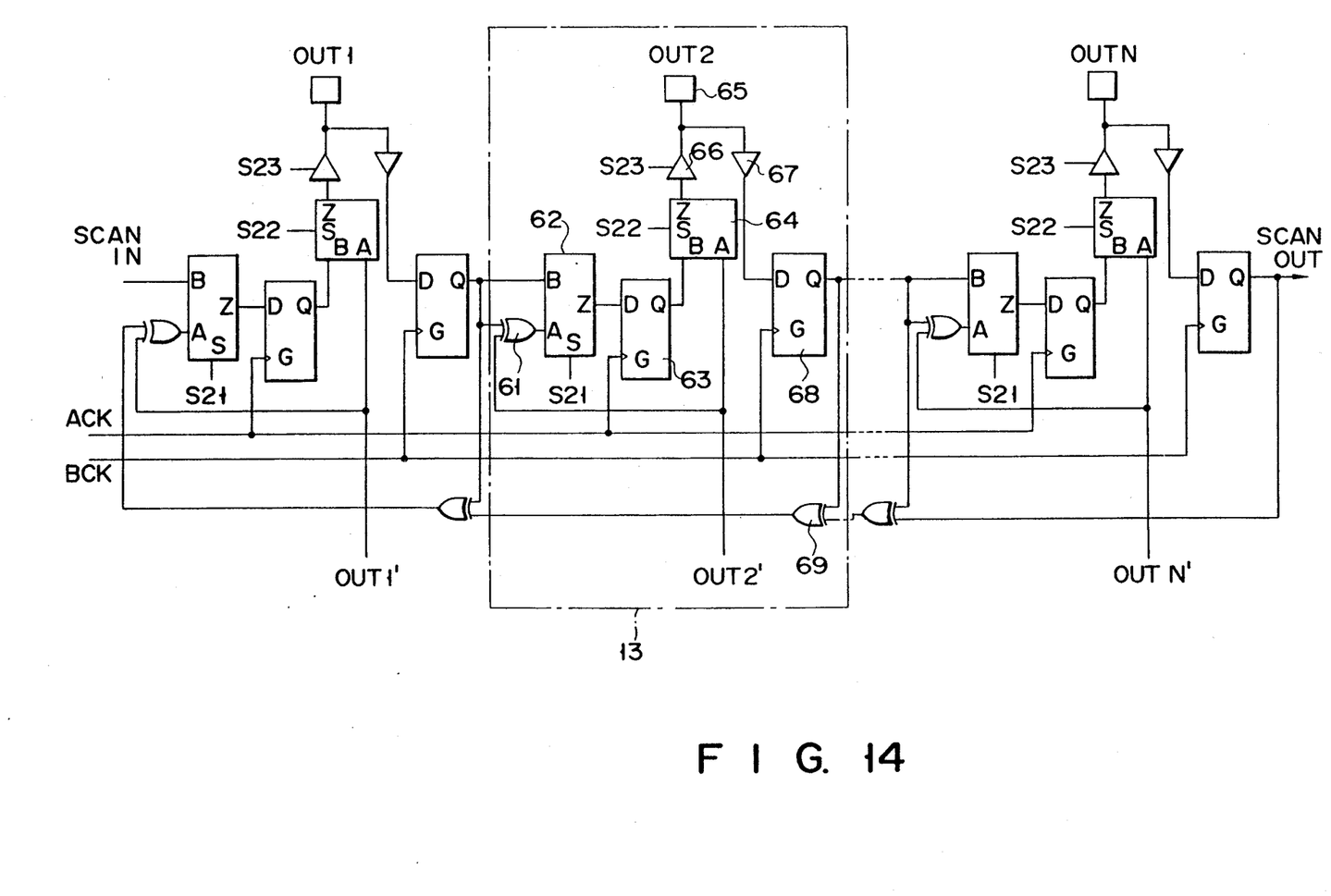
FIG. 14 is a circuit diagram showing the circuit connection between a plurality of output circuits used in the circuit of the embodiment shown in FIG. 6.

FIG. 14 shows a connection between the plurality of input/output circuits 13 of FIG. 6 in a case where the plurality of input/output circuits 13 are exclusively used for output. As shown in the drawing, each input/output circuit 13 includes an exclusive OR circuit 61 supplied with an output signal from one of the input/output circuits, and in all but the first input/output circuits from the previous input output circuit as one of inputs, a multiplexer 62 for receiving the scanning data as an A input and an output of the exclusive OR circuit 61 as a B input and for selecting and outputting the input according to the control signal S21, a D-type latch circuit 63 controlled by the clock signal ACK to latch output data of the multiplexer 62, a multiplexer 64 for receiving an output of the latch circuit 63 as a B input and output data OUT' created in the integrated circuit and output to the exterior from the integrated circuit as an A input and for selecting and outputting the input according to the control signal S22, a tri-state buffer 66 for controlling the supply of an output of the multiplexer 64 to the external output terminal 65 according to the control signal S23, an input buffer 67 connected to the terminal 65, a D-type latch circuit 68 controlled by the clock signal BCK to latch output data of the input buffer 67, and an exclusive OR circuit 69 for deriving an exclusive logical sum of output data of the latch circuit 68 and output data of a latch circuit 68 in another input circuit 13. The output data OUT' created in the integrated circuit is supplied to the exclusive OR circuit 61 as the other input. However, in the first-stage input/output circuit 61 (shown in the leftmost position), not the scanning data but an output of the exclusive OR circuit 69 in a desired one of the input/output circuits 13 is supplied as one of the inputs of the exclusive OR circuit 61. Also, in this case, as will be described later, the position of the exclusive OR circuit 69 may be different according to the bit length and system of the LFSR when the data compactor formed of the LFSR is reconstructed by use of the plurality of input/output circuits, but in the drawing, the exclusive OR circuits are inserted in all of the positions.

With this construction, in the normal operation mode, internal output data OUT' which is the A input in the multiplexer 64 of each of the input/output circuits 13 is output and an output of the multiplexer 64 is supplied to the terminal 65 by means of the tri-state buffer 66 according to the control signal S23. Therefore, the internal output data OUT' is output from the terminal 65 to the exterior of the integrated circuit as data OUT1 through OUTN.

In the scan test mode, the multiplexer 62 selects and outputs scan data which is an output of the preceding stage input/output circuit 13 according to the control signal S21 in each of the input/output circuits 13. Further, the multiplexer 62 selects and outputs an output of the latch circuit 63 according to the control signal S22. In addition, the tri-state buffer 66 supplies an output of the latch circuit 63 to the terminal 65 according to the control signal S23. Therefore, in this case, the scanning input data SCAN IN is sequentially shifted by means of a master-slave type latching structure constituted by the multiplexer circuit 62, latch circuit 63, multiplexer 64, tri-state buffer 66, input buffer 67 and latch circuit 68 of each of the input/output circuits 13 to have the latch circuits 63 and 68 respectively used as master and slave units and output from the last stage input/output circuit (shown in the rightmost position in the drawing) as scanning output data SCAN OUT.

Further, in the compact test mode, an output of the exclusive OR circuit 61 is selected and output by means of the multiplexer 62 according to the control signal S21 in each of the input/output circuits 13. Further, in the multiplexer 62, an output of the latch circuit 63 is selected and output according to the control signal S22. Also, the tri-state buffer 66 of each of the input/output circuits 13 causes an output of the latch circuit 63 to be supplied to the terminal 65 according to the control signal S23. Therefore, in this case, a data compactor formed of the LFSR is reconstructed.

In the external wiring test mode (output) and the external wiring test mode (input), the external wiring test can be effected by the same method as in the case of the circuit shown in FIG. 13.

Figure 15:
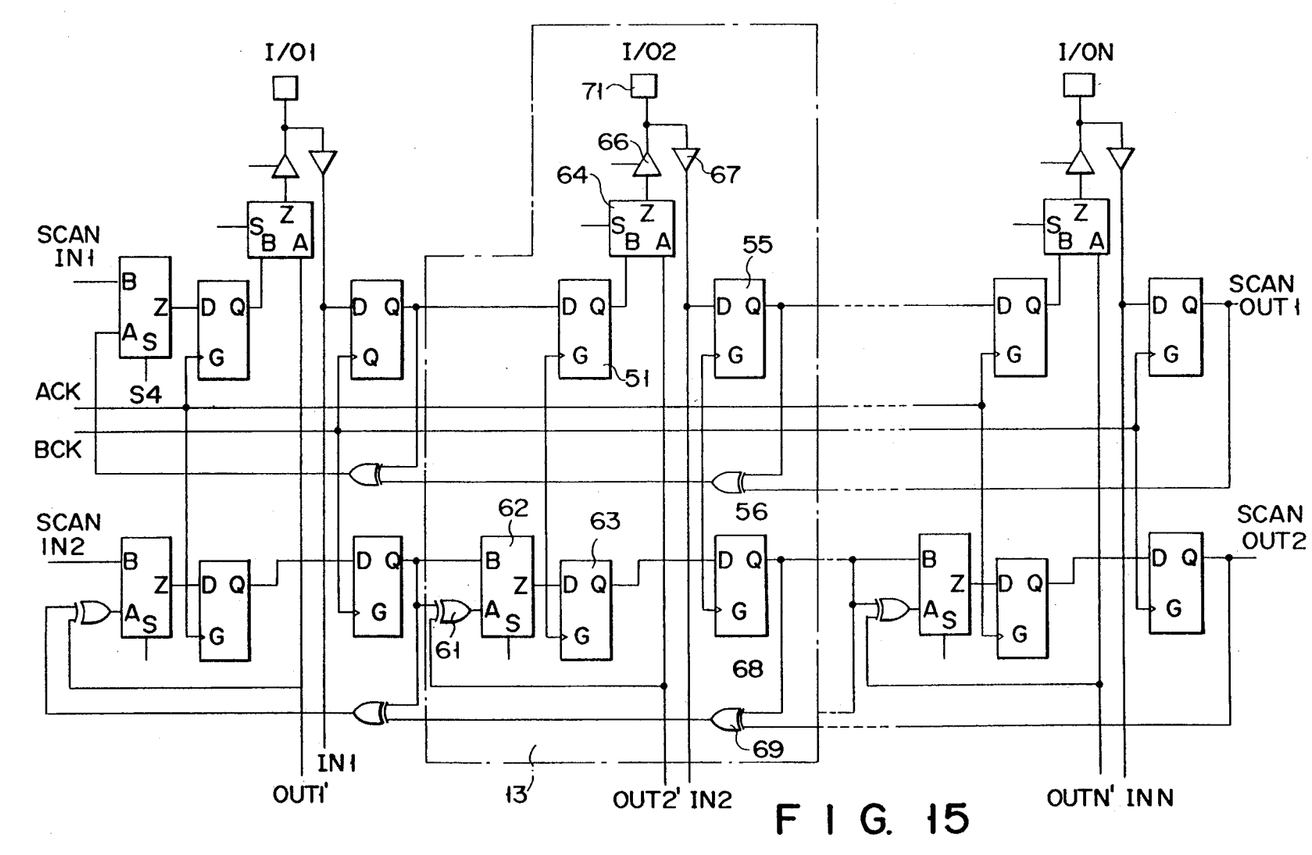
FIG. 15 is a circuit diagram showing the circuit connection between a plurality of input/output circuits used in the circuit of the embodiment shown in FIG. 6.

FIG. 15 shows the connection of the plurality of input/output circuits 13 in a case wherein the plurality of input/output circuits 13 of FIG. 6 are used commonly for input/output. In this case, each of the input/output circuits 13 is connected to an external output terminal 71 and is formed of a combination of the circuits shown in FIGS. 13 and 14. The upper circuit portion in FIG. 15 is used for data input in the normal operation mode, and is used for boundary scanning and random pattern generation in the test mode. Further, the lower circuit portion in FIG. 15 is used for data output in the normal operation mode and is used for data compression in the test mode.

As described above, according to this invention, there is provided a test simplifying circuit in a digital integrated circuit to be tested in which the test simplifying method for attaining a self-test and which will not be influenced by the property of the digital integrated circuit can be realized.

Additional advantages and modifications will readily occur to those skilled in the art. Therefore, the invention in its broader aspects is not limited to the specific details, and representative devices, shown and described herein. Accordingly, various modifications may be without departing from the spirit or scope of the general inventive concept as defined by the appended claims and their equivalents.

What is claimed is:

1. A test simplifying circuit provided in a digital integrated circuit, comprising:
   a random circuit formed of a combination circuit;
   a plurality of memory circuits, coupled to said random circuit, for transmitting data into and out from said random circuit in a non-test mode and for shifting data in series in a scan test mode;
   a plurality of external terminals; and
   a plurality of input/output circuits, respectively connected to said plurality of external terminals and to said plurality of memory circuits, for transmitting data into and out of said digital integrated circuit and said random circuit in the non-test mode, and for shifting data in series in the scan test mode,
   wherein at least one of said plurality of memory circuits together with at least one of said plurality of input/output circuits constitute a linear feedback shift register in the scan test mode.

2. The test simplifying circuit provided in the digital integrated circuit according to claim 1, wherein each of said plurality of memory circuits includes:
   first, second, and third input nodes to which first input data, second input data, and third input data are respectively supplied;
   fourth and fifth input nodes to which a first control signal and a second control signal are respectively supplied;
   sixth and seventh input nodes to which a first clock signal and a second clock signal are respectively supplied;
   an exclusive OR circuit for deriving an exclusive logical sum of the first input data and second input data;
   a first selection circuit for receiving the second input data and output data of the exclusive OR circuit as inputs thereof and for selectively outputting the first and second input data according to the first control signal;
   a second selection circuit for receiving output data of the first selection circuit and the first input data as inputs thereof and for selectively outputting the output data of the first selection circuit and the first input data according to the second control signal;
   a first latch circuit for latching the output data of the second selection circuit in synchronism with the first clock signal;
   a third selection circuit for receiving the third input data and output data of the first latch circuit as inputs thereof and for selectively outputting the output data of the first latch circuit and the third input data according to the second control signal;
   a second latch circuit for latching the output data of the third selection circuit in synchronism with the first clock signal and for outputting a first output data;
   a third latch circuit for latching the output data of the first latch circuit in synchronism with the second clock signal and for outputting a second output data;
   a fourth latch circuit for latching the output data of the second latch circuit in synchronism with the second clock signal and for outputting a third output data; and
   first, second, and third output nodes for respectively outputting the first output data, the second output data, and the third output data from the memory circuit.

3. The test simplifying circuit provided in the digital integrated circuit according to claim 2, wherein
   said plurality of memory circuits are cascade-connected such that the second input node and the third input node of each stage thereof are respectively connected to the second output node and the third output node of a succeeding stage;
   each of the first input nodes is independently supplied with a corresponding one of a plurality of first input signals;
   the fourth input nodes are connected in parallel with one another and the parallel-connected fourth input nodes are supplied with the first control signal;
   the fifth input nodes are connected in parallel with one another and the parallel-connected fifth input nodes are supplied with the second control signal;
   the sixth input nodes are connected in parallel with one another and the parallel-connected sixth input nodes are supplied with the first clock signal;
   the seventh input nodes are connected in parallel with one another and the parallel-connected seventh input nodes are supplied with the second clock signal;
   further, at lease one first exclusive OR circuit into which outputs of said second output nodes of a plurality of first desired stages of the memory circuits are input and at least one second exclusive OR circuit into which outputs of the third output nodes of a plurality of second desired stages of the memory circuits are input;
   an output of at least one first exclusive OR circuit is fed back to the second input node of a first-stage memory circuit to constitute a data compactor in a linear feedback shift register configuration; and
   an output of at least one second exclusive OR circuit is fed back to the third input node of said first-stage memory circuit to constitute a random pattern generator in a linear feedback shift register configuration.

4. The test simplifying circuit provided in the digital integrated circuit according to claim 1, wherein each of the plurality of input/output circuit includes:
   a first latch circuit for latching scanning data;
   an output circuit for controlling supply of an output of the first latch circuit to an external terminal according to a control signal;
   a second latch circuit connected to the external terminal, for latching data of the external terminal or output data of the output circuit; and
   an exclusive OR circuit to which output data of the second latch circuit is supplied.

5. The test simplifying circuit provided in the digital integrated circuit according to claim 1, wherein each of the plurality of input/output circuits includes:
- a first exclusive OR circuit for receiving an output signal from one of the plurality of input/output circuits at one input terminal;
- a first selection circuit for selecting output data of the first exclusive OR circuit and input scanning data according to a first control signal;
- a first latch circuit for latching output data of the first selection circuit;
- a second selection circuit for selecting output data of the first latch circuit and for outputting output data according to a second control signal;
- an output circuit for controlling supply of the output data of the second selection circuit to an external terminal according to a third control signal;
- a second latch circuit connected to the external terminal, for latching data of the external terminal or output data of the output circuit; and
- an exclusive OR circuit to which output data of the second latch circuit is supplied.

* * * * *

UNITED STATES PATENT AND TRADEMARK OFFICE
CERTIFICATE OF CORRECTION

PATENT NO. : 5,175,494
DATED : December 29, 1992
INVENTOR(S) : Takashi Yoshimori It is certified that error appears in the above-identified patent and that said Letters Patent is hereby corrected as shown below:

Claim 3, column 12, line 40, change "lease" to --least--.

Claim 4, column 12, line 59, change "circuit" to --circuits--.

Claim 4, column 12, line 68, change "is" to --are--.

Claim 5, column 14, line 11, change "is" to --are--.

Signed and Sealed this

Eleventh Day of January, 1994

Attest:

BRUCE LEHMAN

*Attesting Officer*  *Commissioner of Patents and Trademarks*